United States Patent [19]

Takemoto

[11] Patent Number: 4,910,745
[45] Date of Patent: Mar. 20, 1990

[54] SEMICONDUCTOR LASER DEVICE

[75] Inventor: Akira Takemoto, Itami, Japan

[73] Assignee: Mitsubishi Denki Kabushiki Kaisha, Tokyo, Japan

[21] Appl. No.: 326,363

[22] Filed: Mar. 21, 1989

Related U.S. Application Data

[62] Division of Ser. No. 155,982, Feb. 16, 1989, Pat. No. 4,849,372.

[51] Int. Cl.⁴ .............................................. H01S 3/19
[52] U.S. Cl. ........................................ 372/46; 357/17
[58] Field of Search .............................. 372/46, 44, 43

[56] References Cited

U.S. PATENT DOCUMENTS

| | | | |
|---|---|---|---|
| 4,426,700 | 1/1984 | Hirao et al. | 372/46 |
| 4,525,841 | 6/1985 | Kitamura et al. | 357/17 |
| 4,692,206 | 9/1987 | Kaneiwa et al. | 372/46 |
| 4,730,329 | 3/1988 | Yoshida et al. | 372/46 |
| 4,786,951 | 11/1988 | Tokuda et al. | 357/17 |
| 4,788,689 | 11/1988 | Tokuda et al. | 372/45 |

FOREIGN PATENT DOCUMENTS

| | | | |
|---|---|---|---|
| 0176028 | 4/1986 | European Pat. Off. | |
| 0205307 | 12/1986 | European Pat. Off. | |
| 0034088 | 2/1985 | Japan | 372/46 |
| 72285 | 4/1985 | Japan | 372/46 |
| 136388 | 7/1985 | Japan | 372/46 |
| 141193 | 6/1986 | Japan | 372/43 |
| 0168986 | 7/1986 | Japan | 372/46 |
| 61-204994 | 9/1986 | Japan . | |
| 274385 | 12/1986 | Japan | 372/46 |
| 219990 | 9/1987 | Japan | 372/43 |
| 230078 | 10/1987 | Japan | 372/43 |

OTHER PUBLICATIONS

"IEEE Journal of Quantum Electronics", vol. QE-21, No. 6 (1985), pp. 619-622.
"High Power Output InGaAsP/InP Buried Heterostructure Lasers", Nakano et al., Electronics Letters, 15th Oct. 1981, vol. 17, No. 21, pp. 782-783.
"Distributed Feedback Laser Emitting at 1.3 μm for High-Bit-Rate Systems", Ishikawa et al., Fujitsu Sci. Tech. J., 22, 5, pp. 451-460 (Dec. 1986).
"Effect of Active Layer Placement on the Threshold Current of 1,3-μm InGaAsP Etched Mesa Buried Heterostructure Lasers", Dutta et al., Appl. Phys. Lett. 45(4), 15 Aug. 1984, pp. 337-339.

Primary Examiner—William L. Sikes
Assistant Examiner—Georgia Y. Epps
Attorney, Agent, or Firm—Leydig, Voit & Mayer

[57] ABSTRACT

A semiconductor laser device of the buried heterostructure type in which leakage current is substantially reduced. A mesa portion carries the active lasing portion of the laser, and current blocking layers are grown at either side of the mesa portion. One of the current blocking layers has its conductivity type inverted to the opposite type to eliminate a current leakage path, thereby to provide a high efficiency low leakage current semiconductor laser. Conductivity inversion is accomplished by adjusting the impurity concentration levels in the layers on either side of the mesa portion, and controllably diffusing impurities from one layer to another until conductivity inversion is accomplished in a thin tip portion of one of the layers.

7 Claims, 5 Drawing Sheets

SEMICONDUCTOR LASER DEVICE

This is a division of application Ser. No. 155,982 filed Feb. 16, 1988 now U.S. Pat. No. 4,849,372.

FIELD OF THE INVENTION

This invention relates to an improved semiconductor laser device and a method for producing such a device.

BACKGROUND ART

Semiconductor laser devices have been produced but they have had various drawbacks, such as difficulty of production or, when produced, excessive leakage current resulting from unwanted contact between certain semiconductor layers in the device.

FIG. 6 shows a cross-sectional illustration of a typical prior art semiconductor laser device described in Japanese Laid-open Patent Publication No. 61-204994. That structure is based on a p type semiconductor substrate 1 having an active layer 2 grown on the substrate, and an n cladding layer 3 grown on the active layer. After the two layers are grown on the substrate during a first liquid phase epitaxial growth process, a pair of channels are etched to produce a mesa structure generally designated at 1' in which a central stripe carrying the active layer and n cladding layer is disposed above the substrate. In order to confine the current within the active layer 2, additional p-n layers are grown on either side of the mesa portion. In the illustrated embodiment, a p type embedded layer 4 is grown over the substrate (as well as over the portions of the active layer 2 and n cladding layer 3 near the edges of the device). Following growth of the p type embedded layer 4, additional layers are grown including an n type current blocking layer 5 and a p type current blocking layer 6. Finally, an n type cladding layer 7 is grown over the entire top surface including the cladding layer 3 and the p type current blocking layer 6 to form a substantially flat portion for receipt of an electrode (not illustrated).

In operation, when a voltage is applied between the p type substrate 1 and the n type cladding layer 7, the holes and electrons which are the carriers of the respective layers are injected into the active layer 2. When the injection current reaches a predetermined (preferably fairly low) level, laser oscillation occurs and light is emitted. The injected carriers are concentrated in the active layer 2, in part b the automatically reversed biased p-n junction comprised of the current blocking layers 5, 6. By virtue of the barrier created by the reverse biased p-n junction 5, 6, current is largely confined within the active region, and the semiconductor laser device should operate at a high efficiency and with low leakage or idle current.

In practice, however, such a laser device does not attain the expected high efficiency because of leakage currents which are created by virtue of the juxtaposition of certain layers in the device. More particularly, in construction of such a device there is contact, and therefore an electrical connection, usually created between the n type current blocking layer 5 and either the n type cladding layer 3 or the n type cladding layer 7, and that connection results in a leakage current through the device. The leakage or idle current which flows in the device is illustrated by the arrows shown in FIG. 6, and is relatively high considering that the resistivity of the n type layer is less than that of the p type layer by about an order of magnitude. Furthermore, since the area of the p-n junction produced between the p type embedded layer 4 and the n type current blocking layer 5 is large, the total leakage current from the n blocking layer to one of the n cladding layers will be quite high. Indeed, it has been found, that when the semiconductor laser is produced by liquid phase epitaxy, the n type current blocking layer 5 and one or the other of the n cladding layers 3, 7 will be connected in almost all cases. Although the width of this connection is generally small, such as 0.1 μm, a large leakage current will flow for the reasons described above.

SUMMARY OF THE INVENTION

In view of the foregoing, it is a primary aim of the present invention to provide an improved semiconductor laser device which can be reliably manufactured, and which, in operation, will reduce leakage current which heretofore had been present between one of the current blocking layers and cladding layers.

More particularly, it is an object of the present invention to provide a definite separation between the n type current blocking layer and the n type cladding layers in such a semiconductor laser device. It is a further object to provide such a definite separation while not unduly complicating the manufacture of the semiconductor laser device.

Other objects and advantages of the present invention will become apparent from the following detailed description when taken in conjunction with the drawings in which:

While the invention will be described in connection with certain preferred embodiments, it will be apparent that there is no intent to limit it to the described embodiments. On the contrary, the intent is to encompass all alternatives, modifications and equivalents included within the spirit and scope of the invention as defined by the appended claims.

DETAILED DESCRIPTION OF THE PREFERRED EMBODIMENTS

Figure 1:
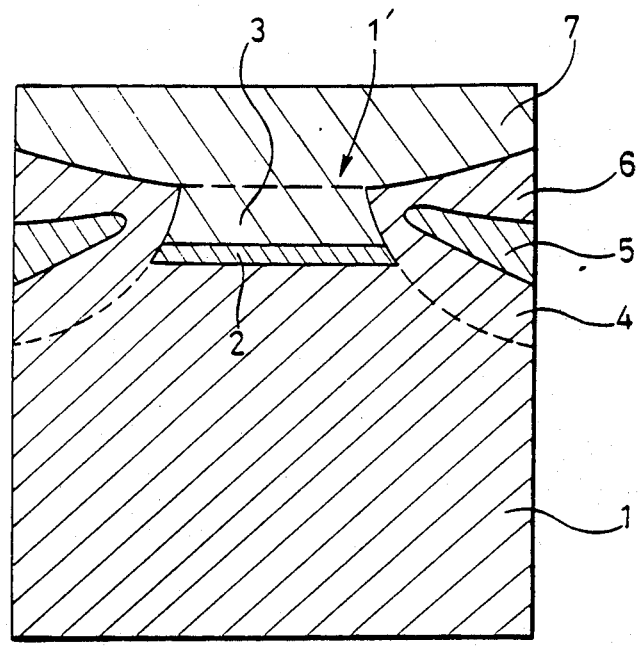
FIG. 1 is a cross-sectional view showing a semiconductor laser device embodying the present invention.

Turning now to FIG. 1, there is shown one embodiment of a semiconductor laser device constructed in accordance with the present invention. In the illustrated embodiment, a p type semiconductor substrate serves as the foundation for the semiconductor. A mesa portion 1' located approximately centrally on the substrate carries an active layer 2 and an n type first cladding layer 3. Current blocking layers are produced at each side of the mesa portion 1'. In the illustrated embodiment, the current blocking structure include a p type embedded layer 4, an n type current blocking layer 5, and a p type current blocking layer 6 successively grown on either side of the mesa portion 1'. An n type cladding layer 7 covers the entire upper surface of the semiconductor device including the n cladding layer 3 and p type current blocking layer 6. Laser devices of this type are often characterized as buried heterostructure devices.

Figure 6:
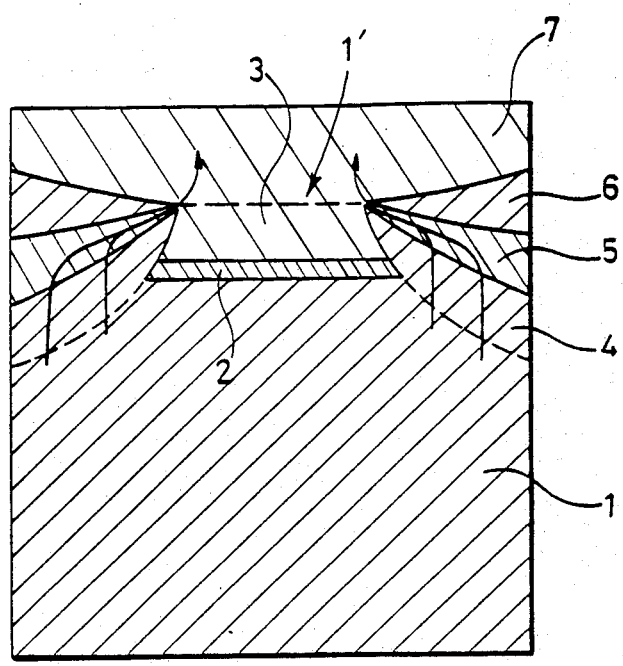
FIG. 6 is a cross-sectional view showing a prior art semiconductor laser device.

It is important to note in the device illustrated in FIG. 1, that the n type current blocking layer 5 terminates before and thus does not contact the mesa portion and is thus electrically isolated from the n cladding layers 3, 7. Thus, although there is the desired reverse biased p-n junction between the n type current blocking layer 5 and its adjacent p type current blocking layer 6, there is no contact between the n type current blocking layer 5 and either of the n cladding layers 3, 7 and thus no leakage path for current which might flow through the p-n junction. As a result of the elimination of the contact and resulting leakage, the semiconductor laser device illustrated in FIG. 1 operates with greater efficiency than prior art devices such as that illustrated in FIG. 6.

Those skilled in the art will appreciate that contacts and the like later added to the semiconductor laser device have not been shown for clarity of illustration of the invention. Those skilled in the art will also appreciate that the laser device is typically of the GaAs type formed by liquid phase epitaxial growth in which InP is usually used as the base for the melt with Zn impurities added when p type layer is desired and Te impurities added when an n type layer is desired.

Figure 2:
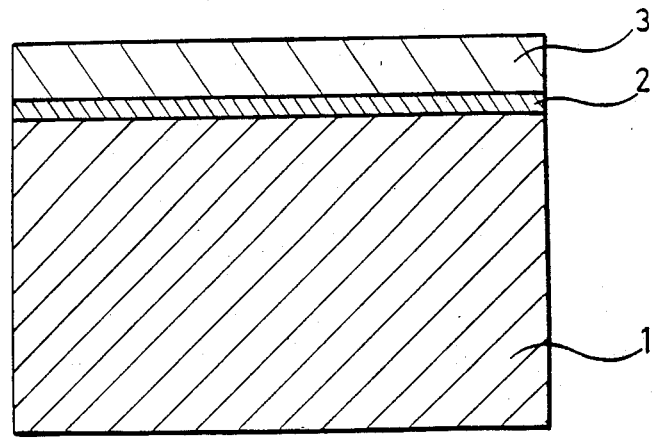
FIGS. 2a to 2c are diagrams representing the manufacturing process for producing semiconductor laser according to the present invention.
Figure 2:
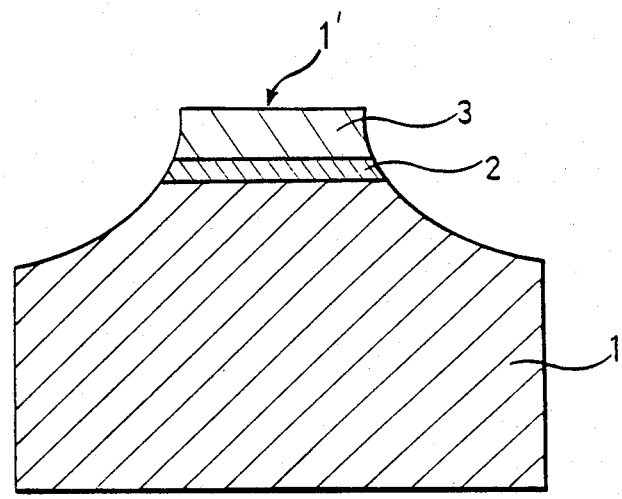
Figure 2C:
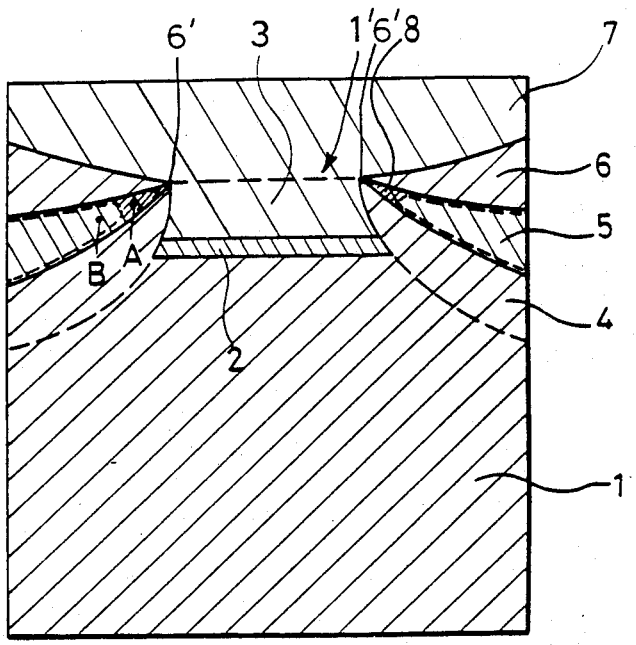

Turning now to FIGS. 2a-2c, the process for producing the semiconductor laser device of FIG. 1 will be described in greater detail. The partially completed device shown in FIG. 2a is that which results from a first stage liquid phase epitaxial growth process. In that first stage process, the semiconductor substrate is produced and the active layer 2 and the first n cladding layer 3 are successively grown on that substrate. Having completed the first stage growth, the mesa portion 1' is produced using conventional techniques. Such techniques typically include a photolithographic process to apply a mask defining the surface of the mesa portion, deposition of an etch resistant such as SiO$_2$ over the surface of the mesa portion, and an etching process to remove portions of the n cladding layer 3, active layer 2 and substrate 1 on either side of the mesa to produce the partially completed device illustrated in FIG. 2b.

Following the formation of the mesa portion, the partially completed semiconductor is then subjected to a second stage liquid phase epitaxial growth which is either followed by or combined with a diffusion process which eliminates contact between the n current blocking layer 5 and the n cladding layers 3, 7. During the first portion of the second stage epitaxial growth process, p type embedded layers 4 are grown on either side of the mesa portion. Additional layers are grown on either side of the mesa portion including the n type current blocking layer 5 and p type current blocking layer 6. Finally, an n type cladding layer 7 is grown over the upper surface of the partially completed semiconductor device to cover both the p type current blocking layer 6 and n type cladding layer 3. It will be appreciated that the liquid phase epitaxial growth process causes the layers 4-6 grown at either side of the mesa portion to grow to points 6' which terminate at the very edge of the mesa portion. Thus, the n current blocking layer 5 will, as in the prior art, tend to contact one or the other of the n cladding layers 3, 7 and thus provide a path for leakage.

In accordance with the invention, however, a tip portion 8 of the n type current blocking layers 5 is inverted to the opposite conductivity type to eliminate the electrical connection and any leakage path resulting therefrom. As will be described in greater detail below, impurities in the p or n layers are diffused by thermal diffusion to invert the conductivity type of tip 8 of the current blocking layer 5. In the illustrated embodiment, the inversion is from n type to p type such that the tip portion 8 represents a p type separation preventing connection between the n type material of the current blocking layer 5 and the n cladding layers 3, 7. In the following, the process of achieving the inversion by thermal diffusion will be described in connection with two specific examples. It should be appreciated, however, that there are numerous process variations which can be incorporated without departing from the scope of the claimed invention.

As a first aspect of the conductivity inversion process, the impurity concentrations for the n and p type layers (typically Te and Zn, respectively) are adjusted with respect to each other so that thermal diffusion within a practical time limit can achieve the desired inversion. In the prior art, the concentration used are such that the n type impurity concentration is typically 5 to 10 or more times that of the p type impurity concentration.

As a first example of practicing the invention, the impurity levels are adjusted for the second stage epitaxial growth process such that the p type impurity concentration for the layers 4, 6 is greater than the n type impurity concentration for the layer 5. Elevated diffusion temperatures applied to the device cause the p type impurities in the layers 4, 6 to diffuse into the layer 5 as suggested by the dashed lines associated with layer 5 in FIG. 2. The diffusion time is adjusted such that diffusion occurs throughout the thin tip portion 8 of the layer 5 but is insubstantial as compared to the thickness of the main body of the layer 5. Thus, the tip portion 8 is inverted from n type to p type conductivity and the desired separation between the n type layer 5 and the n type cladding layers 3, 7 is achieved.

Figure 4:
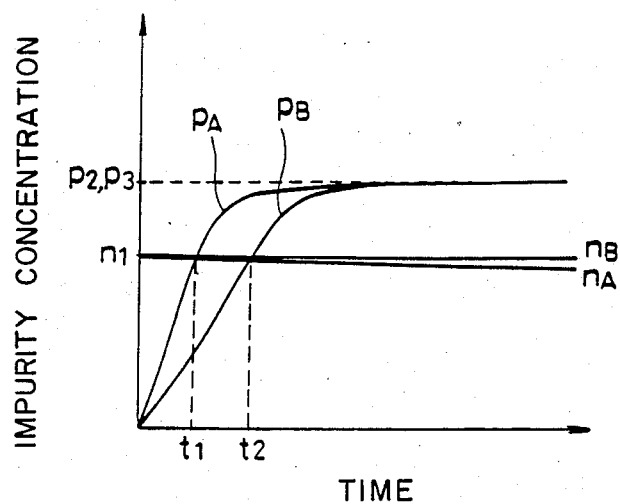
FIGS. 4 and 5 are graphs exemplifying the growth process for particular layers of the semiconductor laser according to the present invention.

Process conditions for accomplishing the inversion just described are illustrated in FIG. 4. In FIG. 4, the horizontal axis represents diffusion time and the vertical axis impurity concentration for both the n and p type impurities. The variable $n_1$ represents the initial n type impurity concentration in the n type current blocking layer 5. The word "initial" is used to refer to impurity concentration at the commencement of the diffusion process and thus relates directly to the impurity concentration in the melt. Similarly, $p_2$ and $p_3$ represent the initial values of the p type concentrations in the p type embedded layer and p type current blocking layer 6, respectively. FIG. 4 illustrates the situation in which there is no p type impurity in the n type current blocking layer 5 at the start of diffusion. The plot shows the change with respect to time of impurity concentrations in the n type current blocking layer 5 at the points A and B (see FIG. 2), i.e., at the tip portion 8 and in the body, respectively, of the layer 5. Thus, for example, $n_A$ represents the n type impurity concentration at point A while $p_B$ represents the p type impurity concentration at point B, and their change with respect to diffusion time.

Since the diffusion speed of the n type impurities (typically Te is quite low with respect to p type impurities (typically Zn), for the time period considered in FIG. 4, there is little change in the n type concentration at the points A and B, and it remains very near its initial value $n_1$. On the other hand, because of the higher diffusion speed of the type impurities, and because of the relatively high concentration of p type impurities in the layers 4, 6, there is a significant change in the p type concentration at both points A and B. Indeed, if diffusion is conducted for a sufficient length of time, the impurity levels at both points A and B can change from substantially zero to substantially $p_2$, $p_3$. It will be apparent that the conductivity types at the points A and B are n types when the n concentration is greater than the p concentration, and p types when n is less than p. Therefore, in the time range between $t_1$ and $t_2$, it is possible to invert the conductivity type at point A, i.e., in the tip portion 8 of the layer 5, while not inverting the conductivity type at the point B in the body portion. Thus, the tip portion conductivity is changed to produce the desired separation, while the body portion remains n type to serve as a current blocking layer. As exemplary impurity concentrations, $n_1 = 5 \times 10^{18}$ cm$^{-3}$, $p_2$, $p_3 = 5.5 \times 10^{18}$ cm$^{-3}$. A diffusion temperature of 600° C. and time of approximately 10 minutes will produce the necessary inversion in the tip portion 8 while retaining the n type conductivity of the body portion.

Utilizing the aforementioned parameters, it is possible to conduct the diffusion in a relatively short time because the inversion is determined largely b the p type impurities which have a relatively high diffusion speed. However, this approach has a disadvantage in that the control of the size of the diffusion region can be difficult.

Figure 5:
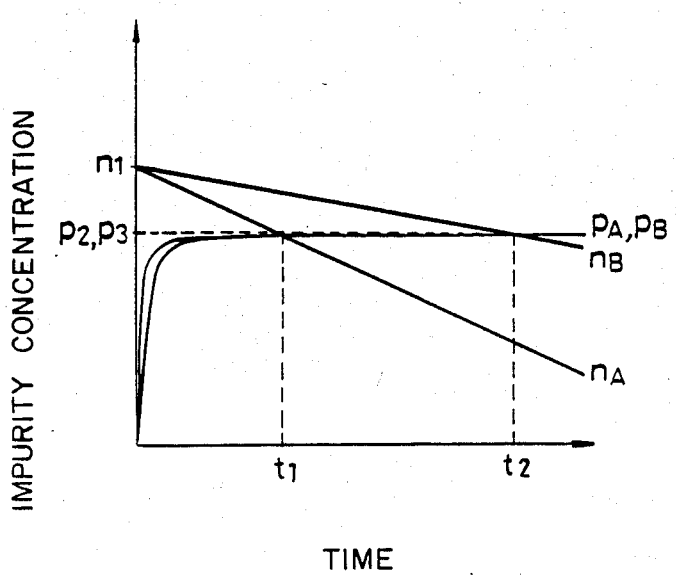

A second set of process parameters can be utilized which lengthen the diffusion time but also provide additional controllability. In an example of such a process, the impurity concentrations are adjusted such that $n_1$ is somewhat greater than $p_2$ and $p_3$. FIG. 5 illustrates the initial conditions as well as the changes in impurity concentration at points A and B with diffusion time. It will be appreciated, however, that the time axis of FIG. 5 is not on the same scale as FIG. 4 and indeed the plot of FIG. 5 represents a much greater total diffusion time than that of FIG. 4.

As can be seen from FIG. 5, the conductivity type inversion is determined by the diffusion of n type impurities. Early in the diffusion cycle, the impurity concentration at both points A and B had increased from about zero to substantially $p_2$, $p_3$, the initial impurity concentration levels of the p type layers 4, 6. However, since that initial concentration is lower than the n type concentration, no conductivity inversion had occurred at that point. However, at the time $t_1$, sufficient n type impurities are diffused out of the n type layer 5 to invert the conductivity type at the point A, i.e., in the tip 8 of the layer 5. At time $t_1$, however, the impurity level $n_B$ at the point B remains greater than the p type level $p_B$ at that point, and no conductivity inversion has occurred at point B. Thus, as in the prior example, the inversion has occurred between the times $t_1$ and $t_2$ and the process conditions are adjusted to achieve a conductivity inversion at point A but avoid such an inversion at point B. Exemplary impurity concentrations in connection with this example are $n_1 = 5 \times 10^{18}$ cm$^{-3}$ and $p_2$, $p_3 = 2 \times 10^{18}$ cm$^{-3}$. In order to achieve the desired inversion, the 600° C. diffusion temperature can be applied for approximately one hour.

It will now be apparent that other combinations of process conditions, including impurity concentration levels, their adjustment with respect to each other, diffusion temperatures and times can be selected to achieve the partial conductivity inversion taught herein. For example, in the case of FIG. 4, where $p_2$ and $p_3$ are greater than $n_1$, if the p type concentration is made substantially greater than the n type the diffusion time is quite short. However, as the p type concentrations are reduced with respect to the n type, the diffusion time increases. Similarly, in the case of FIG. 5 where the initial n type concentration is greater than the initial p type concentration, if $n_1$ is made much greater than $p_2$ and $p_3$, the diffusion time to achieve an inversion is quite long. However, as $n_1$ approaches $p_2$ and $p_3$, the diffusion time to achieve inversion substantially reduces.

In both the examples of FIGS. 4 and 5, if the diffusion temperature is increased, the diffusion proceeds more quickly and the diffusion time must be reduced in order to achieve the desired partial inversion. Thus, the values $n_1$, $p_2$ and $p_3$ are related and can be adjusted along with diffusion time and diffusion temperature to achieve the desired result.

In addition, it is possible to utilize other diffusion conditions if the tip portion 8 of the layer 5 is made thinner by altering the conditions of the crystal growth.

In the foregoing examples, the initial p type impurity concentrations $p_2$ and $p_3$ were considered to be the same for purposes of convenience. However, in some circumstances, it may be desirable to utilize different p type concentrations for the layers 4 and 6 and adjust diffusion conditions appropriately.

It will also be apparent that the diffusion process can be combined with or separated from the second stage crystal growth process, as desired. More particularly, diffusion may be conducted as a completely separate process after crystal growth is completed. Alternatively, the diffusion can be conducted as a part of the crystal growth process and immediately after growing of the crystal layers by holding the grown crystal at a high temperature for the required time. The crystal need not be removed from the crystal growing apparatus for the diffusion since no diffusion mask is required.

Figure 3:
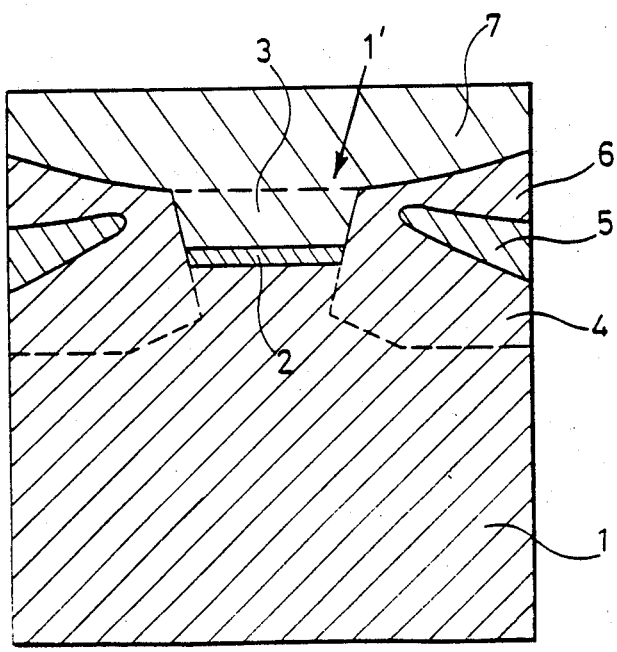
FIG. 3 is a cross-sectional view showing a semiconductor laser device in accordance with a further embodiment of the present invention.

In the embodiments described above, the mesa configuration is a forward mesa configuration, i.e., one in which the mesa base is larger than the top portion of the mesa. It will be apparent that conventional techniques can be used to produce a reverse mesa configuration, and the invention can be applied to the reverse mesa configuration as illustrated in FIG. 3. In FIG. 3, as in FIG. 2, the p type substrate 1, active layer 2 and n type cladding layer 3 are formed in a first phase crystal growth process. The mesa is then etched and p type embedded layer 4, n type current blocking layer 5 and p type current blocking layer 6 are grown at either side of the mesa followed by an n type cladding layer 7 covering the entire upper surface of the device. As in the earlier cases, the n type layer 5, when initially grown, came to a point at the corner of the mesa, but a conductivity inversion by thermal diffusion was accomplished to isolate the n type current blocking layer 5 from the n cladding layers 3, 7, thereby to prevent leakage.

It will now be apparent that what has been provided is a low threshold current, high efficiency semiconductor laser device which has a low idle current by virtue of the minimization of current leakage through the device. The method for producing the device includes a thermal diffusion process which partly inverts the conductivity type of one of the layers thereby eliminating what had been a troublesome leakage path in the prior art.

What is claimed is:

1. A semiconductor laser device comprising:
   a first conductivity type semiconductor substrate;
   a mesa portion on the substrate including an active layer and a second conductivity type first cladding layer;
   successively grown impurity carrying layers on the substrate at both sides of the mesa portion including a first conductivity type embedded layer, a second conductivity type first current blocking layer, and a first conductivity type second current blocking layer;
   a second conductivity type second cladding layer disposed on the second current blocking layer and the first cladding layer; and
   the first current blocking layer having a tip portion adjacent tee mesa portion inverted from the second to the first conductivity type, thereby to minimize current leakage through said semiconductor laser device.

2. The semiconductor laser device as defined in claim 1 wherein diffused impurities in the tip portion serve to invert the conductivity type.

3. The semiconductor laser device as defined in claim 1, wherein at least one of the embedded layer and the second current blocking layer has a high impurity concentration relative to the first current blocking layer, whereby the impurities in said at least one of the embedded layer and the second current blocking layer control the inversion of the conductivity type of the tip portion.

4. The semiconductor laser device as defined in claim 1 wherein the first current blocking layer has an impurity concentration which is greater than that of the embedded layer and the second current blocking layer, whereby the impurities in the first current blocking layer control the inversion of the conductivity type of the tip portion.

5. The semiconductor laser device as defined in claim 1 wherein the tip portion of the first current blocking layer is of a predetermined dimension.

6. The semiconductor laser device as defined in claim 5 in which the predetermined dimension is at least 0.1 microns.

7. The semiconductor laser device as defined in claim 1 in which the tip portion of the first current blocking layer is located above the active layer.

* * * * *